United States Patent [19]
Leeds et al.

[11] Patent Number: 5,760,607
[45] Date of Patent: Jun. 2, 1998

[54] SYSTEM COMPRISING FIELD PROGRAMMABLE GATE ARRAY AND INTELLIGENT MEMORY

[75] Inventors: Kenneth E. Leeds, Sunnyvale; Charles R. Erickson, Fremont, both of Calif.

[73] Assignee: Xilinx, Inc., San Jose, Calif.

[21] Appl. No.: 888,607

[22] Filed: Jul. 7, 1997

Related U.S. Application Data

[63] Continuation of Ser. No. 500,294, Jul. 10, 1995, abandoned.

[51] Int. Cl.$^6$ .................................................. H03K 19/177
[52] U.S. Cl. ............................... 326/38; 326/39; 326/41
[58] Field of Search .................................. 326/38, 39, 40, 326/41, 189.12

[56] References Cited

U.S. PATENT DOCUMENTS

| | | | |
|---|---|---|---|
| Re. 34,363 | 8/1993 | Freeman | 326/38 |
| 3,473,160 | 10/1969 | Wahlstrom | 340/172.5 |
| 3,553,651 | 1/1971 | Bird et al. | 340/172.5 |
| 3,629,857 | 12/1971 | Faber | 340/172.5 |
| 3,816,725 | 6/1974 | Greer | 235/152 |
| 3,818,452 | 6/1974 | Greer | 340/166 |
| 3,849,638 | 11/1974 | Greer | 235/152 |
| 4,020,469 | 4/1977 | Manning | 340/172.5 |
| 4,062,059 | 12/1977 | Suzuki et al. | 364/200 |
| 4,096,565 | 6/1978 | Ruckdeschel et al. | 364/200 |
| 4,125,870 | 11/1978 | Suzuki et al. | 364/900 |
| 4,138,732 | 2/1979 | Suzuki et al. | 364/900 |
| 4,145,755 | 3/1979 | Suzuki et al. | 364/900 |
| 4,161,778 | 7/1979 | Getson, Jr. et al. | 364/200 |
| 4,163,291 | 7/1979 | Suzuki et al. | 365/221 |

(List continued on next page.)

FOREIGN PATENT DOCUMENTS

| | | |
|---|---|---|
| 0 055 348 | 7/1982 | European Pat. Off. . |
| 58-205870 | 11/1983 | Japan . |
| 1 444 084 | 7/1976 | United Kingdom . |

OTHER PUBLICATIONS

"Configuration EPROMs for Flex Devices" Version 5, dated Jun. 1996 available from Altera Corporation, 2610 Orchard Parkway, San Jose, CA 95134–2020.

"Configuring FLEX 8000 Devices" Version 1, Mar. 1993 available from Altera Corporation, 2610 Orchard Parkway, San Jose, CA 95134–2020.

Wood, Roy A., Yu–nian Hsien, Cyril A. Price and Paul P. Wang, "An Electrically Alterable PLA for Fast Turnaround–Time VLSI Development Hardware," Oct. 1981, *IEEE Journal of Solid–State Circuits*, vol. SC–16, No. 5, pp. 570–577.

Shoup, Richard G., "Programmable Cellular Logic Arrays" (Thesis), Mar. 1970, Carnegie–Mellon University.

Shoup, Richard G., "Programmable Cellular Logic," 5th Annual IEEE Conference on Hardware, Software, Firmware and Tradeoffs, Sep. 1971, pp. 27–28.

Greer, David L., "An Associative Logic Matrix," Oct. 1976, *IEEE Journal of Solid–State Circuits*, vol. SC–11, No. 5, pp. 679–691.

Raffel, J.I., "On the Use of Nonvolatile Programmable Links for Restructurable VLSI*," Jan. 1979, Caltech Conference, California Institute of Technology.

EPC1 Configuration EPROM for FLEX Devices, Altera Corp., Jul. 1995.

(List continued on next page.)

*Primary Examiner*—Edward P. Westin
*Assistant Examiner*—Benjamin D. Driscoll
*Attorney, Agent, or Firm*—Kenneth E. Leeds, Esq.; Skjerven, Morrill et al.; Edel M. Young

[57] ABSTRACT

A memory device controls the flow of data from the memory device to a configurable logic device. This is in contrast to circuits in which a configurable logic device generates a clock signal that controls the flow of data from a memory device to a configurable logic device. In one embodiment, the configurable logic device is a field programmable gate array ("FPGA"). The memory device can provide the configuration data on a serial output lead or a parallel data bus.

33 Claims, 13 Drawing Sheets

U.S. PATENT DOCUMENTS

| | | | |
|---|---|---|---|
| 4,236,225 | 11/1980 | Jansen et al. | 364/900 |
| 4,258,418 | 3/1981 | Heath | 364/200 |
| 4,270,183 | 5/1981 | Robinson et al. | 364/900 |
| 4,271,480 | 6/1981 | Vinot | 364/900 |
| 4,285,038 | 8/1981 | Suzuki et al. | 364/200 |
| 4,342,081 | 7/1982 | Dubuc | 364/200 |
| 4,433,394 | 2/1984 | Torii et al. | 365/221 |
| 4,486,854 | 12/1984 | Yuni | 364/900 |
| 4,507,760 | 3/1985 | Fraser | 365/221 |
| 4,521,874 | 6/1985 | Rau et al. | 365/221 |
| 4,527,233 | 7/1985 | Ambrosius, III et al. | 364/200 |
| 4,535,427 | 8/1985 | Jiang | 365/205 |
| 4,716,551 | 12/1987 | Inagaki | 365/222 |
| 4,847,812 | 7/1989 | Lodhi | 365/221 |
| 4,870,302 | 9/1989 | Freeman | 326/39 |
| 4,893,281 | 1/1990 | Hashimoto | 365/230.06 |
| 4,940,909 | 7/1990 | Mulder et al. | 326/38 |
| 5,109,353 | 4/1992 | Sample et al. | 364/578 |
| 5,117,388 | 5/1992 | Nakano et al. | 365/189.12 |
| 5,146,577 | 9/1992 | Babin | 365/189.12 |
| 5,270,981 | 12/1993 | Sumi | 365/236 |
| 5,394,031 | 2/1995 | Britton et al. | 326/38 |
| 5,394,032 | 2/1995 | Conzelmann et al. | 326/38 |
| 5,432,741 | 7/1995 | Devore et al. | 365/189.12 |
| 5,444,660 | 8/1995 | Yamanaka et al. | 365/189.12 |
| 5,493,239 | 2/1996 | Zlotnick | 326/38 |
| 5,543,730 | 8/1996 | Cliff et al. | 326/38 |

OTHER PUBLICATIONS

Configuring FLEX 10K Devices, Altera Corp., Dec. 1995.

Anderson, Allan H., "Semiannual Technical Summary Report ot the Defense Advanced Research Projects Agency," Apr. 1979–Mar. 1980, Massachusetts Institute of Technology, Lincoln Laboratory.

Configuring Multiple Flex 8000 Devices (Application Note 38), published by Altera Corporation in May 1994.

"Dynamic Logic Array", IBM Technical Disclosure Bulletin, vol. 29, No. 1, Jun. 1986.

"XC5200 Logic Cell Array Family", published by Xilinx, Inc., in May 1995.

"Automatic Test, Configuration, and Repair of Cellular Arrays", by Frank Blase Manning, Massachusetts Institute of Technology, May 1975.

S.E. Wahlstom, "Programmable Logic Arrays –Cheaper by the Millions", Electronics, Dec. 11, 1967.

"FIFO RAM Controller", Document No. 57/674219, published by Monolithic Memories, Inc. 1986.

"8257/8257-5 Programmable DMA Controller", published by Intel Corporation in 1979.

"Programmable Logic Data Book", published by Xilinx, Inc. in 1994.

SYSTEM COMPRISING FIELD PROGRAMMABLE GATE ARRAY AND INTELLIGENT MEMORY

This application is a continuation of application Ser. No. 08/500,294, filed Jul. 10, 1995, abandoned.

BACKGROUND OF THE INVENTION

"The Programmable Logic Data Book" ("Xilinx Data Book"), published by Xilinx, Inc. ("Xilinx") in 1994, describes field programmable gate arrays ("FPGAs") manufactured and sold by Xilinx. (The Xilinx Data Book is incorporated herein by reference.) These FPGAs are capable of retrieving configuration data from a serial or parallel memory. For example, the Xilinx Data Book discusses a circuit in which an FPGA receives configuration data from a serial PROM when the FPGA is in a master serial configuration mode, e.g. as shown in FIG. 1. Referring to FIG. 1, an FPGA 1 generates a clock signal on a clock signal line 2. This clock signal is received by a serial PROM 3, which generates in response thereto a serial data stream on an output line 4. The serial data is received by FPGA 1, which becomes configured in response thereto. When FPGA 1 is done configuring itself, it asserts a DONE signal on line 5, indicating that configuration is complete. This signal deselects PROM 3.

A variation of this system is shown in FIG. 2. The FIG. 2 system includes first and second FPGAs 1a and 1b. During system initialization, FPGA 1a sends clock signals on line 2 to both PROM 3 and FPGA 1b. PROM 3 responds to the clock signals by providing data signals to FPGA 1a on line 4. During configuration, FPGA 1a is in the "master serial configuration mode" and FPGA 1b is in the "slave configuration mode". In this variation, when FPGA 1a is done configuring itself, it continues to send clock signals to serial PROM 3 and FPGA 1b. Serial PROM 3 thus continues to send data to FPGA 1a via line 4. This data is passed from FPGA 1a to FPGA 1b via a line 7. FPGA 1b takes the data from line 7 and uses that data to configure itself. FPGAs 1a and 1b include open drain output buffers which drive leads 5a and 5b, respectively. Leads 5a and 5b are "AND-tied" together. When FPGAs 1a and 1b are both done being configured, the signal on leads 5a and 5b goes high, indicating that both FPGAs are done being configured, and deselecting PROM 3.

Another variation of FPGA configuration is shown in FIG. 3, in which an FPGA 10 communicates address signals via an address bus 11 to a parallel EPROM 12. EPROM 12 responds by providing data signals on a data bus 13 (typically 8 bits wide). These data signals are received by FPGA 10, which configures itself in accordance with this data. This type of programming mode is known as a master parallel configuration mode.

Instead of relying on the FPGA to generate clock signals which are applied to a PROM during serial configuration mode, or relying on the FPGA to generate address signals during master parallel configuration mode, it is known to rely on an intelligent device, such as a microprocessor, to generate clock and/or address signals. Thus, as shown in FIG. 4, it is known to use a microprocessor 20 to address EPROM 21 via address lines 22. Microprocessor 20 retrieves configuration data via data bus 23, and passes that configuration data to FPGA 24 via a serial data line 25. Timing is controlled by a clock signal communicated on a clock signal line 26 by microprocessor 20. When FPGA 24 is programmed in this manner, it is in the slave serial mode.

Other known modes for configuring FPGAs include a peripheral asynchronous mode and a peripheral synchronous mode. In these modes an intelligent device such as a microprocessor writes configuration data to the FPGA, typically a byte at a time. (See pages 2–38 to 2–41 of the Xilinx Data Book).

Xilinx FPGAs can be configured in each of the foregoing modes. Each of these modes has its own advantages and disadvantages. Using a serial PROM is often advantageous because serial PROMs have a small number of pins and are relatively inexpensive. To use a serial PROM, at least one FPGA in the system must be capable of generating a clock signal for causing the serial PROM to provide configuration data. Since FPGAs are mass-produced, and support all these configuration modes, they all contain clock and oscillator circuitry, even though the devices in slave serial configuration mode never use this circuitry.

In master parallel mode, the FPGA must also have oscillator and clock circuitry, and circuitry for generating addresses.

In any configuration mode that uses an intelligent device such as a microprocessor, the resources of that microprocessor must be used to initialize any FPGAs in the system.

SUMMARY

An FPGA system in accordance with this invention includes a circuit having a memory and capable of generating the necessary signals to program an FPGA integrated circuit without requiring external intelligent circuitry such as a microprocessor and without requiring the FPGA to contain clock or oscillator circuitry. In one embodiment, the memory circuit generates a clock signal and a serial data signal which is received by an FPGA during configuration. In another embodiment, the memory circuit sends several bits of configuration data in parallel to the FPGA (typically one byte at a time) during configuration. In either event, the resources of a microprocessor are not required, nor is it necessary for the FPGA to contain clock and oscillator circuitry.

In one embodiment, the memory is an integrated circuit. The memory can employ PROM, EPROM, EEPROM, fuse, antifuse, ROM or other technology.

BRIEF DESCRIPTION OF THE DRAWINGS

FIG. 5b illustrates a variation of the embodiment of FIG. 5a.

FIG. 8b schematically illustrates a variation of the embodiment FIG. 8a.

DETAILED DESCRIPTION

Figure 5A:
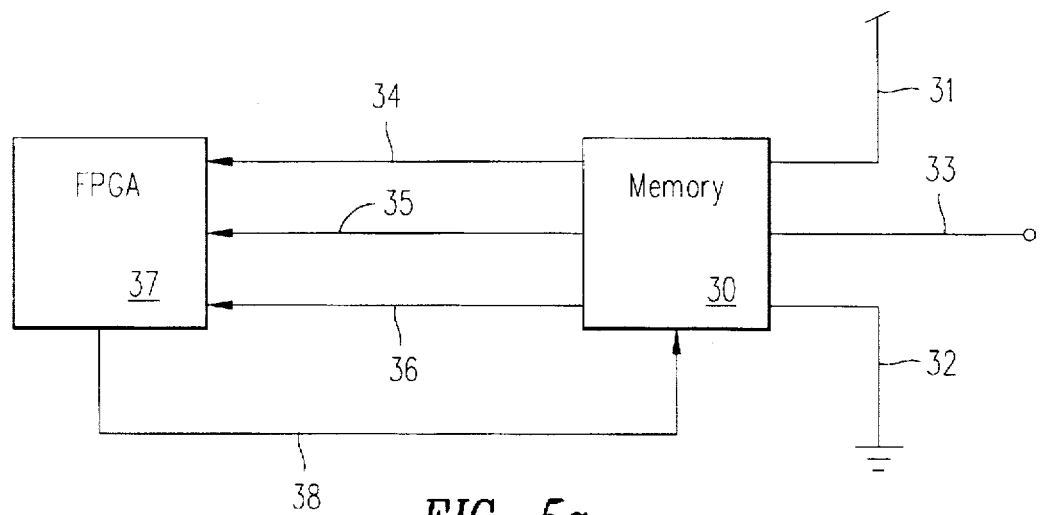
FIG. 5a schematically illustrates an FPGA being configured by a memory circuit in accordance with a first embodiment of the invention.

Referring to FIG. 5a, a memory integrated circuit 30 receives power signals Vcc (typically 5 volts), ground and an optional reset signal on lines 31, 32 and 33, respectively. The reset signal can be generated by the circuitry in which the system of FIG. 5a is incorporated. In one embodiment, the reset signal is generated by a host microprocessor (not shown), or a control button on the system.

Memory circuit 30 includes a data output signal lead 34, a clock output signal lead 35, and a reset signal output signal lead 36. Upon power up (or when the signal on reset signal line 33 goes active), memory circuit 30 asserts a reset signal on lead 36, which is received by an FPGA integrated circuit 37. This reset signal puts FPGA 37 in a "configuration mode". During configuration, memory circuit 30 provides clock and data signals on leads 35 and 34, which are received by FPGA 37 and used to configure FPGA 37. When FPGA 37 is done configuring itself, it asserts a DONE signal on a lead 38, indicating that configuration is complete, and causing memory circuit 30 to cease transmitting configuration data.

In one embodiment, memory circuit 30 is an EPROM, but other memory technologies (fuses, antifuses, SRAMs, EEPROMs, mask-programmed ROMs, etc.) can also be used.

FPGA 37 is typically an integrated circuit comprising an array of configurable logic elements. These elements can have a structure such as the logic element structure used in the Xilinx XC2000, XC3000, XC4000 or XC5000 families of devices. These elements can also have a structure such as that disclosed in U.S. Pat. No. Re 34,363 (incorporated herein by reference) or the structure used in the Flex series of FPGAs manufactured by Altera Corporation. Configuration data can be routed from the FPGA serial data input lead (coupled to lead 34) to configuration memory cells within the FPGA in the same manner as in the Xilinx or Altera devices, or as described the '363 patent. However, in accordance with this invention, timing is typically controlled by the clock signal generated by memory circuit 30.

Figure 1:
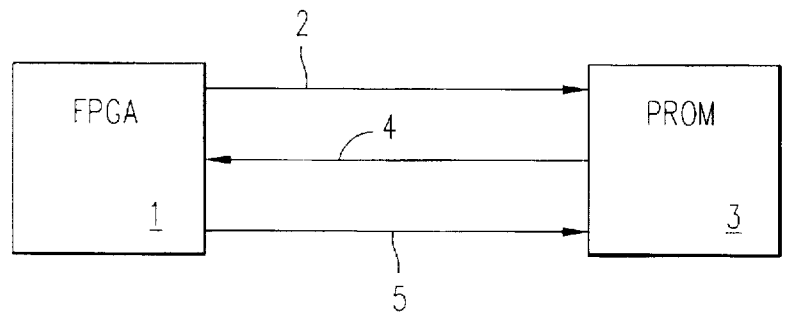
FIG. 1 schematically illustrates an FPGA in master serial configuration mode.
Figure 2:
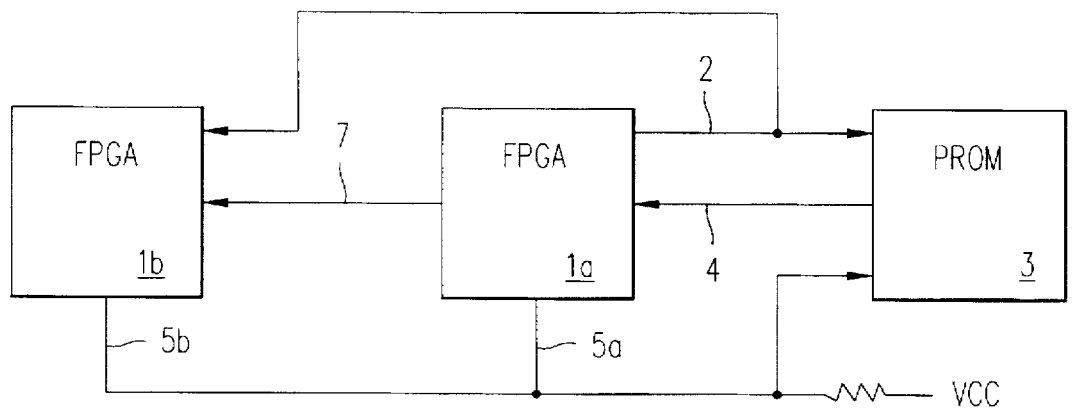
FIG. 2 schematically illustrates one FPGA in master serial configuration mode and one FPGA in slave serial configuration mode.
Figure 3:
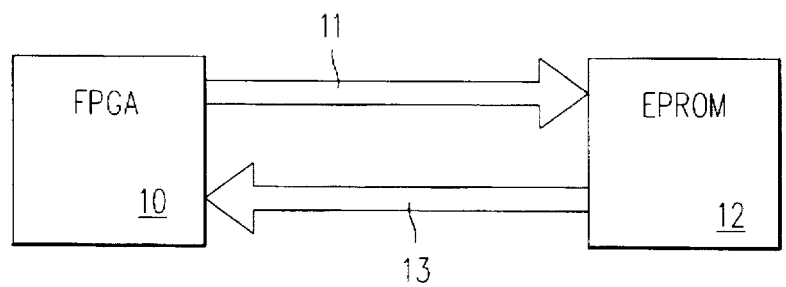
FIG. 3 schematically illustrates an FPGA during parallel configuration.
Figure 4:
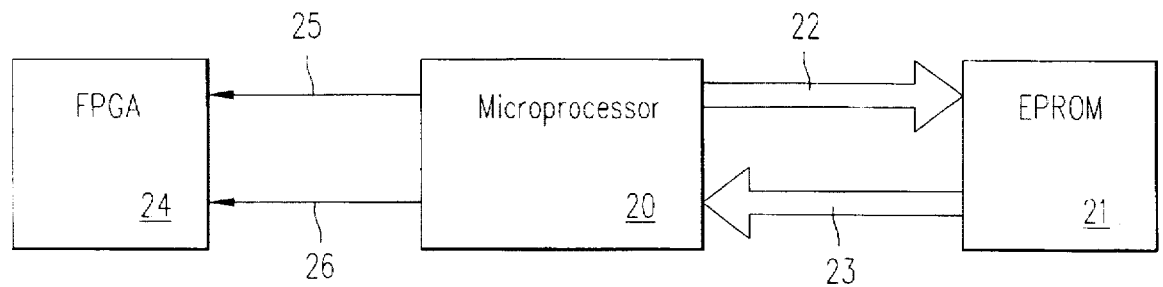
FIG. 4 schematically illustrates an FPGA being configured by a microprocessor.
Figure 6:
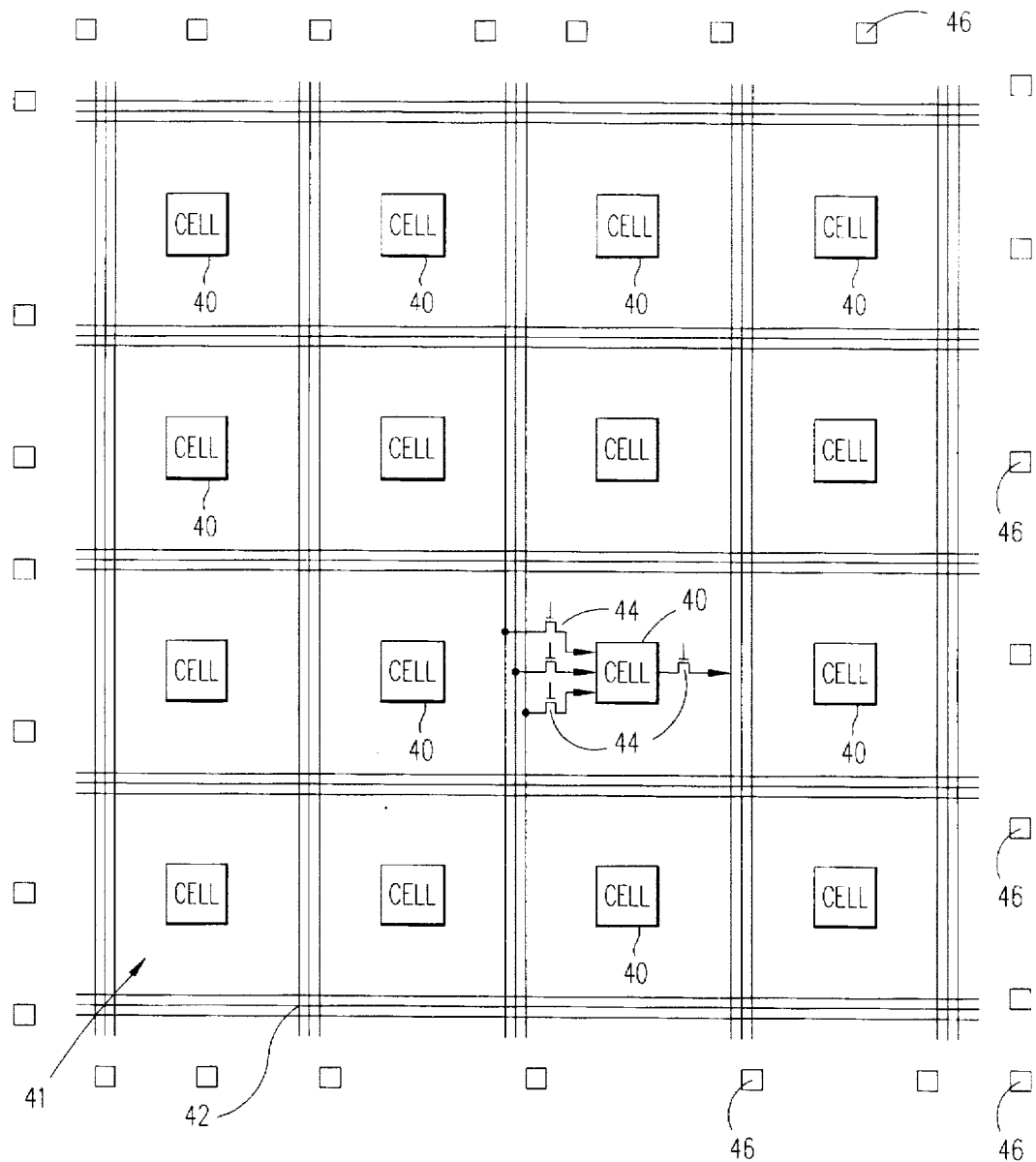
FIG. 6 illustrates an FPGA.

The exact details of the FPGA used in accordance with the invention are not critical. Generally, an FPGA contains an array of configurable logic elements, e.g. as shown in '363 Patent FIGS. 2, 3a or 3b, or Xilinx Data Book FIG. 1 (page 2–20 of the Xilinx Data Book). FIG. 6 shows a block diagram of an example of an FPGA, which contains an array of configurable logic elements, or cells 40, arranged in an array 41 of rows and columns. Each cell 40 can be programmed, or configured, to perform any of a number of logic functions. Interspersed about cells 40 is a wiring grid 42. The input and output leads of cells 40 can be programmably electrically coupled to the wires in grid 42. In one embodiment, this programmable electrical coupling is accomplished using pass transistors or tri-state buffers driven by SRAM memory cells. However, other techniques can be used. FIG. 6 shows one of the cells (cell 40a) coupled to wiring grid 42 via pass transistors 44. The other cells 40 are also coupled to the wiring grid via pass transistors and each cell input or output line may be coupled to more than one wire of grid 42, but this is not shown in FIG. 6 for the sake of clarity.

Although grid 42 is illustrated as showing three wires between adjacent rows and columns of cells 40, other numbers of wires are typically provided between adjacent rows and columns of cells. Also, although the wires in grid 42 are shown as extending the entire length and width of the array, typically, wires within grid 42 have varying lengths, some extending a short distance, some extending a longer distance.

Although not shown for the sake of clarity, the horizontal wires in grid 42 are typically programmably connected to the vertical wires in grid 42 at some of the locations where the horizontal and vertical wires cross.

Surrounding array 41 is a set of programmable I/O cells 46, which can be programmably connected to wires 42. I/O cells 46 can receive signals from the I/O pins of the FPGA, and provide those signals onto selected wires within grid 42. In addition, I/O cells 46 can receive signals from grid 42 and provide those signals to the I/O pins. In this way, signals from outside the FPGA can be communicated via I/O cells 46 to wiring grid 42, and to selected cells 40 within array 41. Output signals from the various cells can be communicated via grid 42 to other cells 40 within array 41, and/or to I/O cells 46 via grid 42.

The programmable interconnections between the various structures shown in FIG. 6 and the configuration of cells 40 are typically controlled by SRAM memory cells within the FPGA (not shown). The SRAM memory cells within the FPGA can be arranged as a shift register (see the '363 Patent) or arranged as described in the Xilinx Data Book, or as in the Xilinx XC2000, XC3000, XC4000 or XC5000 family of circuits, or as in the Altera Flex circuits. However, in lieu of using SRAM memory cells, other reprogrammable memory cells, e.g. EEPROM memory cells can be used in an FPGA in accordance with the invention.

Figure 7A:
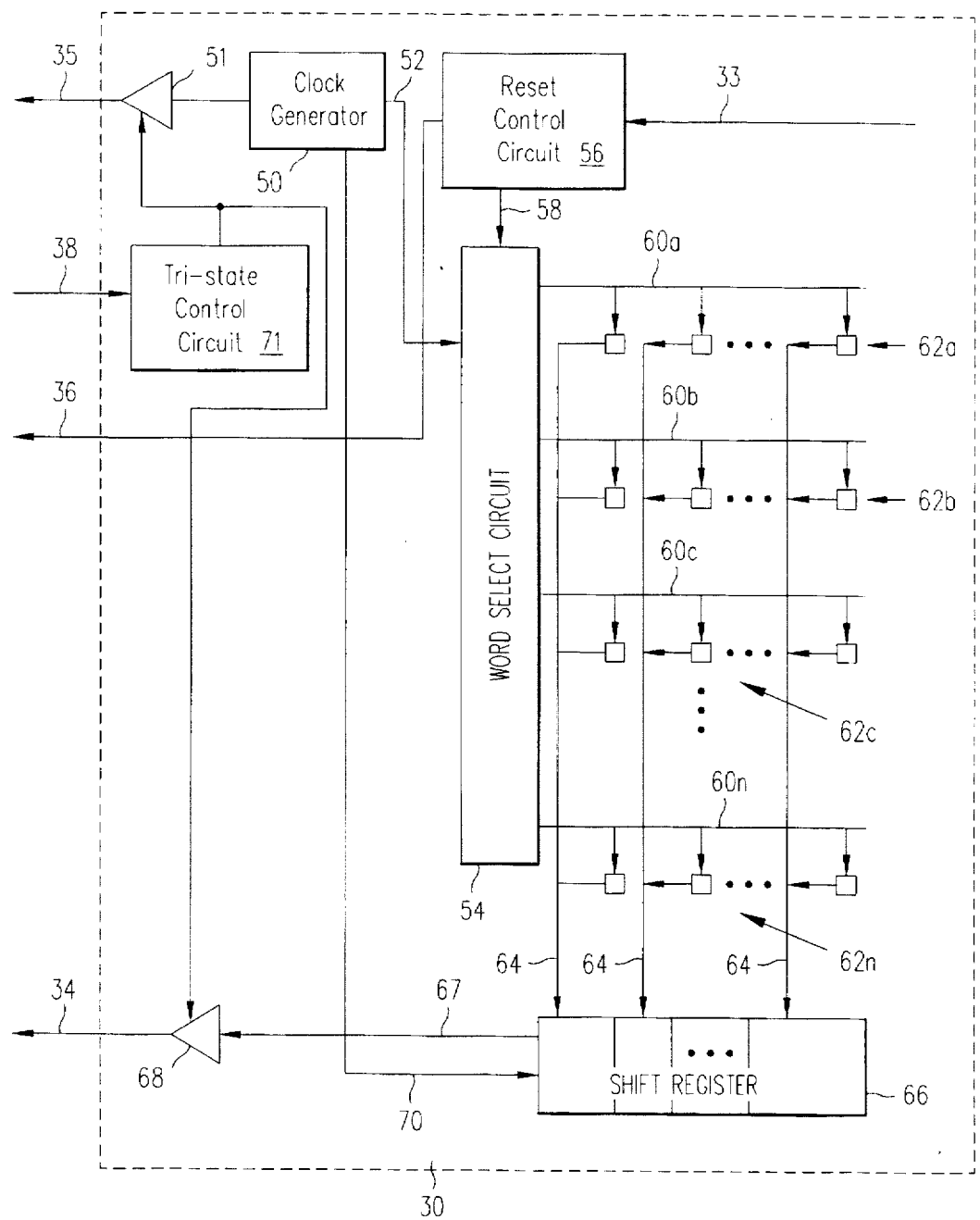
FIG. 7a is a block diagram of the memory circuit of FIG. 5.

FIG. 7a is a block diagram of memory circuit 30. As shown in FIG. 7a, a clock generator circuit 50 provides a clock signal on lead 35 via a tri-state buffer 51. (As mentioned above, the clock signal on lead 35 is used by FPGA 37 during configuration.) Clock generator circuit 50 can contain a conventional oscillator. For example, in one embodiment, clock generator 50 may contain a multivibrator. Alternatively, clock generator 50 can contain an odd number of inverting circuits connected in the form of a feedback loop. Alternatively, clock generator 50 can be coupled to a crystal, LC circuit or other structure external to memory circuit 30. Clock generator 50 also provides a clock signal on a lead 52 which drives a sequential address select circuit 54. Upon power-up or receipt of a signal on reset line 33, a reset control circuit 56 applies a reset signal to FPGA 31 via lead 36, and a reset signal to address select circuit 54 via a lead 58. The reset signal on lead 58 causes circuit 54 to assert an active output signal on a select line 60a, which in turn causes the data in a selected row of memory cells 62a to be communicated via lines 64 to a shift register 66. The data from shift register 66 is shifted out onto data output lead 34 via a lead 67 and a tri-state buffer 68. The timing of this shifting function is controlled by a clock signal on a clock line 70 provided by clock generator circuit 50. The clock signals on lines 35 and 70 have identical frequencies. When all of the data from row 60a has been shifted out from shift register 66, clock generator 50 provides a clock signal to address select circuit 54 via clock line 52. Address select circuit 54 responds to this clock signal by holding select line 60a inactive and asserting an active output signal on the next select line 60b, which in turn causes data from a second row of memory cells 62b to be loaded into shift register 66. The process thus repeats itself until either a) all of the data from memory cells 66 has been shifted out; or b) FPGA 37 asserts a signal on line 38 indicating that configuration is complete. When memory circuit 30 receives this signal from line 38, a tri-state control circuit 71 tri-states buffers 51 and 68. In this way, memory circuit 30 controls the configuration of FPGA 37. (Because buffers 51 and 68 are tri-stated, the input pins of FPGA 37 driven by leads 34 and 35 during configuration can be used for other tasks after configuration is complete.

Figure 7B:
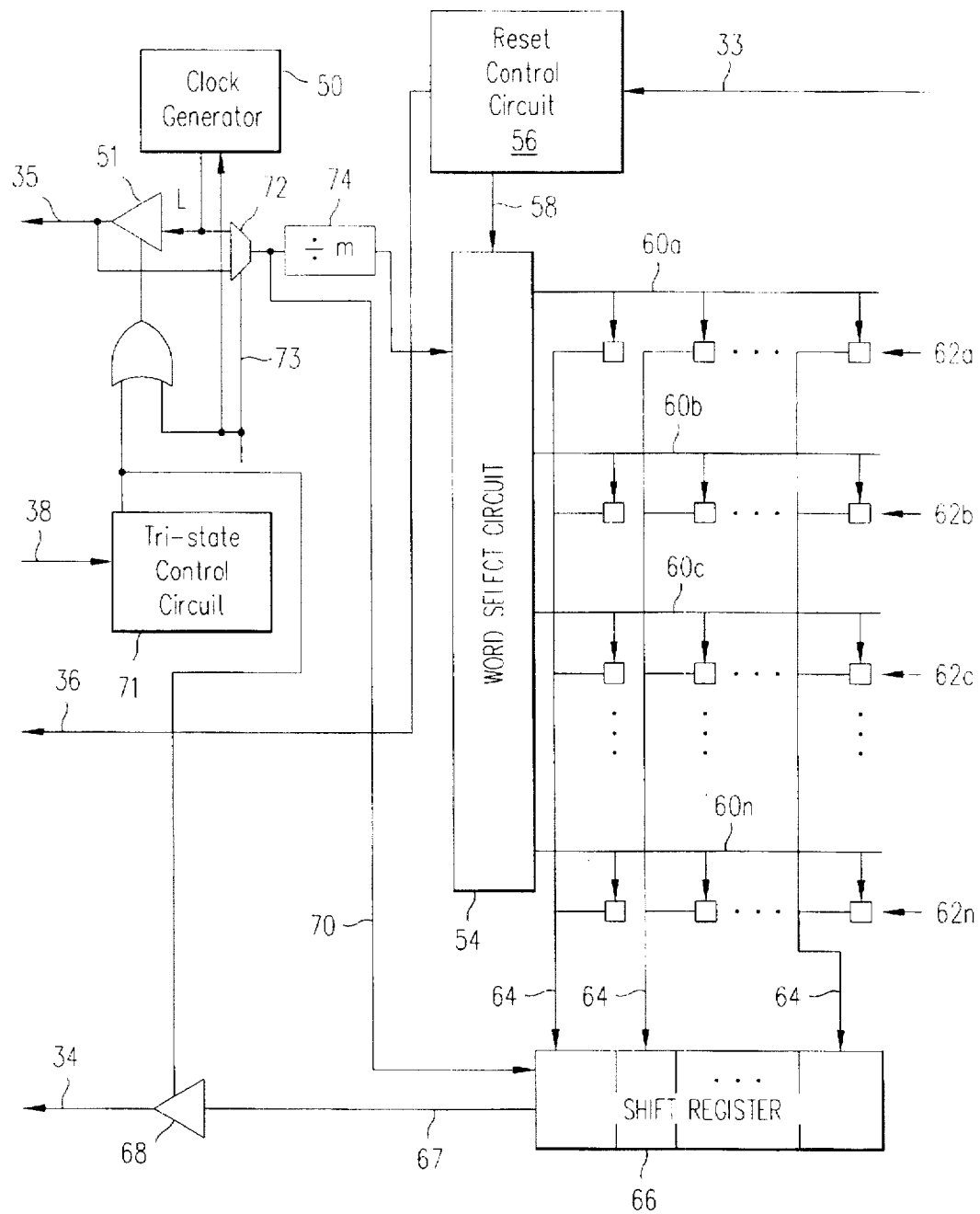
FIG. 7b is a block diagram of an alternate embodiment of the memory circuit of FIG. 7a including means for receiving an externally generated clock signal.

FIG. 7b illustrates an alternative embodiment of a memory circuit in accordance with my invention comprising a multiplexer 72 and a control lead 73. In this embodiment, when the signal on control lead 73 is low, multiplexer 72 passes clock signals from clock generator circuit 50 to shift register 66 via lead 70 as described above. These clock signals control the shifting of data from shift register 66. In addition, the clock signals from clock generator 50 are coupled to a divide by m circuit 74 via multiplexer 72. The output signal from divide by m circuit drives address selector circuit 54. Shift register 66 contains m bits, where m is an integer, e.g. 8. Thus, address select circuit 54 is clocked by divide by m circuit 74 every time m bits from shift register 66 are provided to output lead 34, i.e. every time shift register 66 is emptied of its contents.

When the signal on control lead 73 is high clock generator circuit 50 is disabled, tri-state buffer 51 is put in a tri-state mode, and lead 35 serves as a clock input lead to memory circuit 30. In this mode, the clock signal received on lead 35 is coupled to shift register 66 via multiplexer 72 and lead 70. In addition, as mentioned above, the output signal from multiplexer 72 drives divide by m circuit 74, which in turn clocks address selector circuit 54. In this way, the memory circuit can use either an internally generated clock signal (from clock generator 50) or an externally generated clock signal (received from lead 35), depending on the state of the signal on control lead 73. Of importance, the signal on control lead 73 can be received via an input pin from a device external to memory circuit 30. Alternatively, the signal on control lead 73 can be provided by a memory cell within memory circuit 30 that is programmed at the same time as the memory cells within rows 62a–62n.

Although FIG. 7b uses lead 35 as a bi-directional lead that can either receive or provide a clock signal, in other embodiments, lead 35 is not bi-directional, and a separate lead is used to receive an externally generated clock signal.

When power is first applied to the circuit of FIG. 5a, it may take time before the voltage levels within FPGA 37 reach proper values. Further, FPGA 37 may have to reset some or all of its internal memory cells to a known state prior to configuration. Thus, in one embodiment, memory circuit 30 provides a time delay between power-up and the time memory circuit 30 begins to provide configuration data, to ensure that FPGA 37 is ready to receive that configuration data.

Figure 5B:
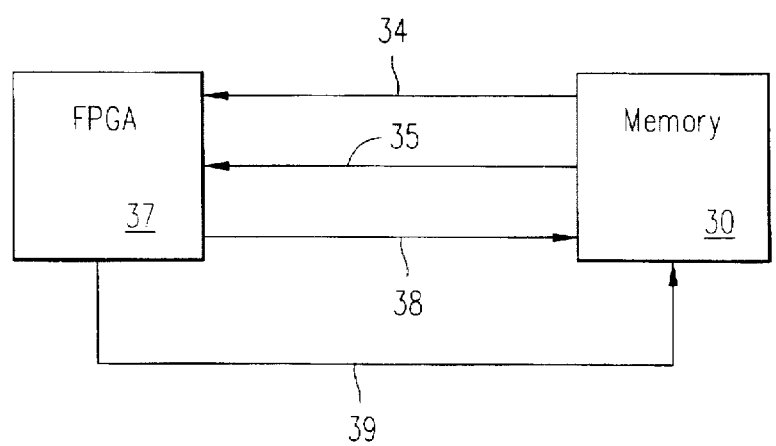

Alternatively, as shown in FIG. 5b, FPGA 37 may have an output lead 39 coupled to memory circuit 30. In this embodiment, memory circuit 30 commences sending configuration data upon receipt of an INIT signal on lead 39. The INIT signal is provided by FPGA 37 to indicate that it is ready to receive data.

Alternatively, if there is a momentary drop in the voltage applied to the Vcc pin of FPGA 37, FPGA 37 can contain circuitry which determines whether there is a risk that configuration data have been lost. In the event of such a risk, FPGA 37 can assert the INIT signal at that time to start reconfiguration.

Figure 8A:
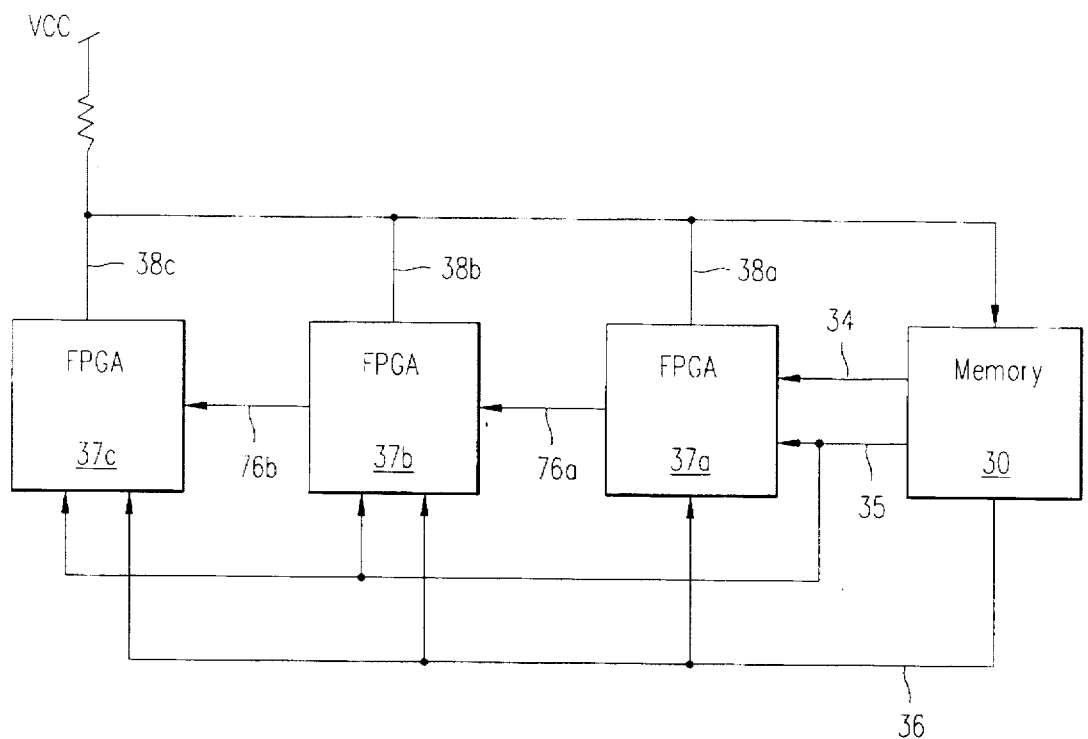
FIG. 8a schematically illustrates a plurality of FPGAs being configured by a memory circuit in accordance with a second embodiment of the invention.

FIG. 8a illustrates a variation of the embodiment of FIG. 5a, in which three FPGAs 37a, 37b and 37c are configured. All three devices receive the clock signal from memory 30 via lead 35. Of importance, FPGAs 37a and 37b include serial output leads 76a and 76b, respectively. At the start of configuration, memory circuit 30 provides preamble data to FPGA 37a via line 34, including a length count indicating how many bits of configuration data are going to be provided to FPGAs 37a–37c. This preamble data is stored in FPGA 37a, and passed on to FPGAs 37b and 37c via lines 76a and 76b, respectively. Thereafter, FPGA 37a receives configuration data from memory 30 via lead 34 and uses that data to configure itself, but holds its serial output lead 76a high. As soon as FPGA 37a is done configuring itself, FPGA 37a begins to pass the serial data from lead 34 to lead 76a. This data is then used by FPGA 37b to configure itself. While FPGA 37b is configuring itself, it holds serial output lead 76b high. As soon as FPGA 37b is done configuring itself, it begins to pass the serial data from lead 76a to lead 76b. FPGA 37c receives and uses the data from lead 76b to configure itself. Of importance, each FPGA 37a to 37c includes a counter which increments every time a clock signal is received on lead 35. When the number of counted clock signals equals the length count, then all of FPGAs 37a to 37c know that configuration is complete. Each FPGA 37a, 37b, 37c includes an associated open drain output line 38a, 38b, 38c which are "AND-tied" and coupled to memory circuit 30. When FPGAs 37a, 37b and 37c have counted a number of clock pulses equal to the length count, all of lines 38a, 38b and 38c are held active (e.g. high), which then causes memory circuit 30 to tri-state buffers 51 and 68 (FIG. 7a), and to cease sending configuration data to the FPGAs. While FIG. 8a shows three FPGAs, the same principle can be applied to any other number of FPGAs.

Of importance, in FIG. 8a, it is unnecessary that FPGAs 37a–37c contain clock or oscillator circuits.

In an alternative variation of the embodiment of the FIG. 8a, FPGA 37a turns off the transistor driving open drain lead 38a when FPGA 37a is done being loaded with configuration data, FPGA 37b turns off the transistor driving lead 38b when FPGA 37b is done being loaded with configuration data, and so forth. In this alternative, FPGAs 37a to 37c do not rely on counting clock signals to determine when to assert a signal on leads 38a to 38c.

In another alternative, memory circuit 30 includes a counter 120 (FIG. 7c) that is reset by the signal provided on lead 58 by reset control circuit 56 at the start of configuration. Counter 120 counts the clock pulses on lead 70. Memory circuit 30 also includes a register 122 that contains the number of configuration bits stored in memory circuit 30. (The data in register 122 can be loaded into the memory circuit at the same time as the data in memory cells 62.) Of importance, a comparator 124 provides an output signal on an output lead 126 when the contents of counter 120 and register 122 are equal, indicating that the last bit of configuration data has been provided by memory circuit 30. This signal causes buffers 51 and 68 to be tri-stated. In this way, memory circuit 30 determines when configuration is complete without relying on a signal from the FPGAs.

In another embodiment (FIG. 7d), address select circuit 54 contains an address counter 58a and an address decoder 58b. (Counter 58a is reset by the reset signal on lead 58 and incremented by the signal on lead 52.) In FIG. 7d, comparator 124 compares the address in counter 58a with the contents of register 122 to determine when the last bit of data has been provided to the FPGAs.

In another embodiment (FIG. 7e), when a word of data equalling a code value (for example, all ones) is loaded into shift register 66, a circuit 128 detects the presence of this code value and asserts an output signal on a lead 130 that tri-states buffers 51 and 66. In this way, the code value is programmed into memory cells 62 to mark the location of the last bit of configuration data.

Figure 8B:
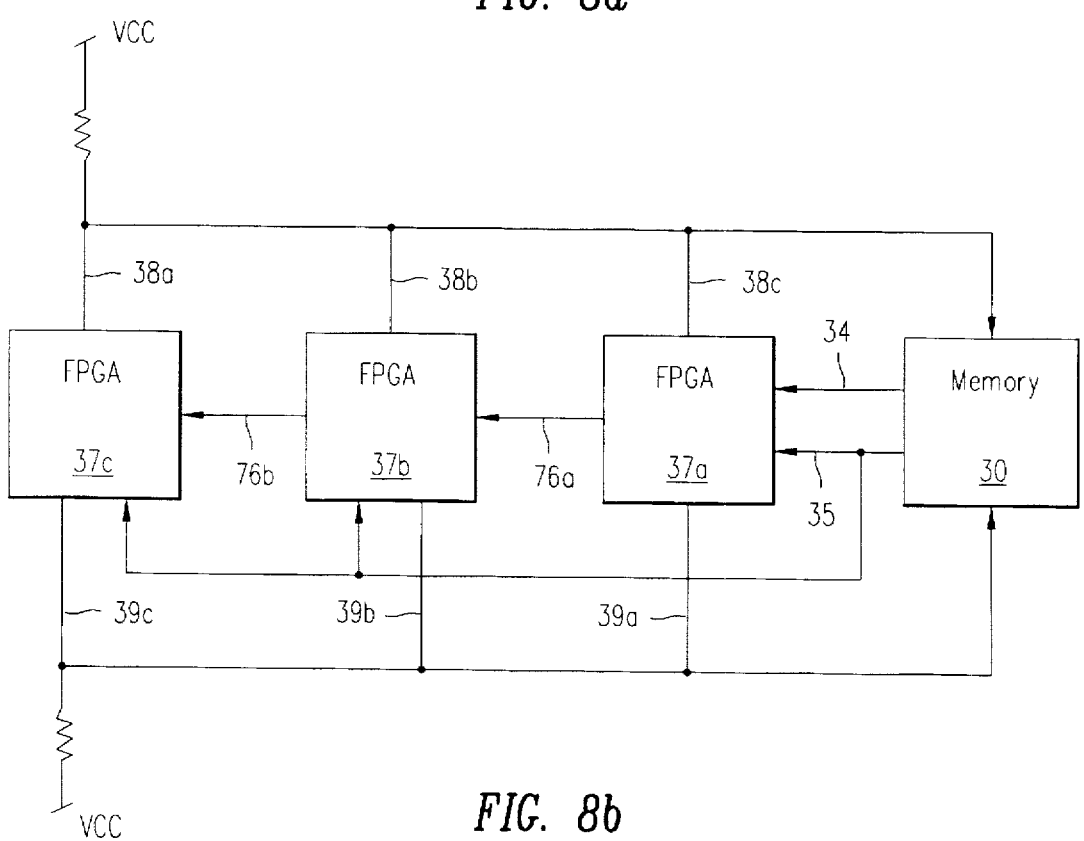

FIG. 8b illustrates a variation of the circuit FIG. 8a in which FPGAs 37a to 37c provide INIT signals on output leads 39a to 39c, respectively. Of importance, the circuits driving leads 39a to 39c are open drain, and leads 39a to 39c are "AND-tied". FPGAs 37a to 37c provide INIT signals when they require and are ready to receive configuration data as described above. Each of FPGAs 37a to 37c also monitors leads 39a to 39c, and are put into configuration mode if any one of the other FPGAs assert an INIT signal.

Figure 9:
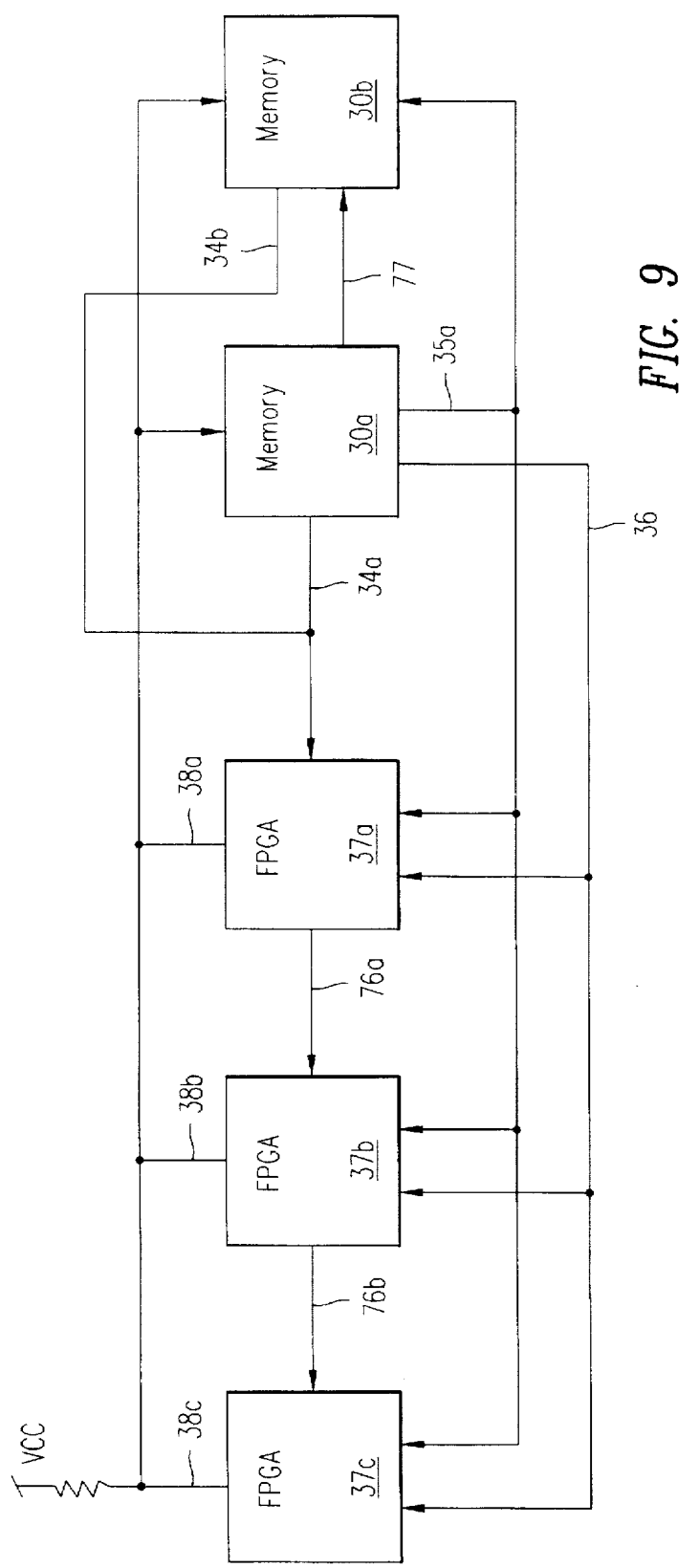
FIG. 9 schematically illustrates a plurality of FPGAs being configured by a pair of memory circuits in accordance with a third embodiment of the invention.

FIG. 9 shows another embodiment of my invention containing an optional memory circuit 30b. Of importance, if a design calls for more data than can be stored in one serial memory, two or more memories such as memories 30a and 30b can be cascaded. In FIG. 9, data output leads 34a and 34b are coupled together to drive the data input lead of FPGA 37a. Upon power-up, memory circuit 30a asserts a deselect signal on a lead 77 that deselects memory circuit 30b, causing memory circuit 30b to tri-state the buffer driving output lead 34b. Memory circuit 30a then shifts the data stored therein onto lead 34a. When the last bit of data from memory circuit 30a has been shifted out onto lead 34a, memory circuit 30a tri-states the buffer driving output lead 34a, and asserts a select signal on lead 77, which causes memory circuit 30b to begin sending data via lead 34b to FPGA 37a. In one embodiment, this is done under control of the clock signal provided on clock lead 35a by memory circuit 30a.

In an alternative embodiment, memory circuit 30b generates its own clock signal on a clock lead tied to lead 35a. When memory 30a is providing data, memory circuit 30b tri-states its clock output lead, whereas when memory circuit 30b is providing data, memory circuit 30a tri-states its clock lead.

As in the previous embodiment, when all of FPGAs 37a to 37c are done being configured, an active signal is asserted on leads 38a to 38c. These leads are AND-tied, and are used to deselect memory circuits 30a and 30b upon completion of configuration.

While FIG. 9 illustrates two memory circuits 30a, 30b, it should be noted that other numbers of serial memory circuits can be used.

Figure 10:
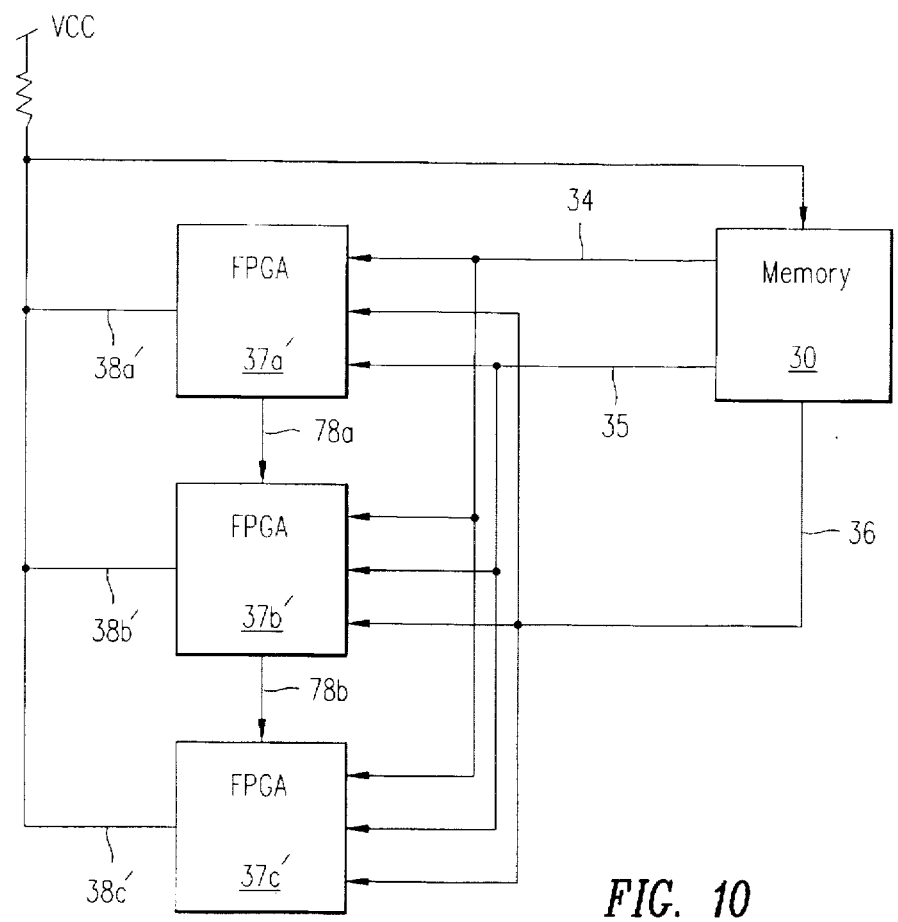
FIG. 10 schematically illustrates a plurality of FPGAs being configured by a memory circuit in accordance with a fourth embodiment of the invention.

FIG. 10 illustrates a variation of my invention in which memory circuit 30 is used to configure FPGAs 37a', 37b' and 37c'. In FIG. 10, upon power-up, memory circuit 30 sends clock and data signals to FPGAs 37a' to 37c' via leads 34 and 35. Initially, FPGA 37a' and FPGA 37b' communicate inactive signals on leads 78a and 78b, respectively thereby causing FPGA 37b' and 37c' to ignore the clock and data signals on leads 35 and 34. FPGA 37a' then uses the data signals from memory circuit 30 to configure itself. When FPGA 37a' is done configuring itself, it holds lead 78a active, which causes FPGA 37b' to receive the data and clock signals from memory circuit 30 via leads 34 and 35 and use the data to configure itself. When FPGA 37b' is done being configured, it holds lead 78b active, and FPGA 37c' begins storing data from lead 34. As in the embodiments of FIGS. 8 and 9, output leads 38a' to 38c' of FPGAs 37a' to 37c' are AND-tied together, and go active when all FPGAs are done configuring themselves, which in turn causes memory circuit 30 to tri-state the buffers driving its clock and data output leads.

In one embodiment, FPGA 37a' includes an input lead corresponding to the input lead in FPGA 37b' coupled to lead 78a. This input lead in FPGA 37a' is tied active, causing FPGA 37a' to make use of the configuration data provided by memory circuit 30 at the start of configuration.

Although FIG. 10 shows three FPGAs being configured, this technique can be used to configure other numbers of FPGAs.

Figure 11:
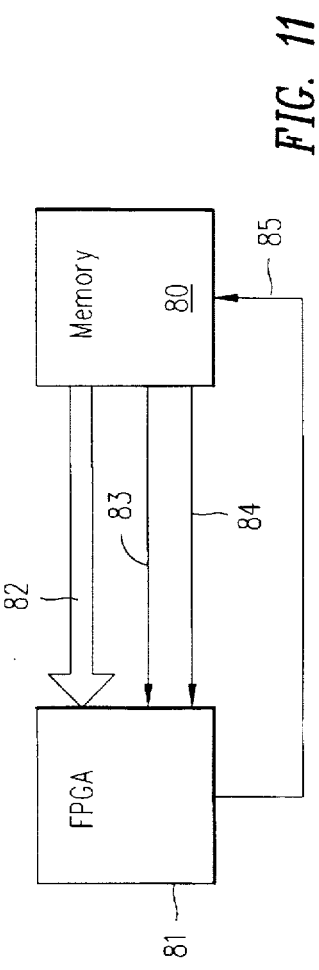
FIG. 11 schematically illustrates an FPGA being configured by a parallel memory accordance with a fifth embodiment of the invention.

FIG. 11 illustrates another embodiment of the invention which uses a parallel memory integrated circuit 80 instead of serial memory circuit 30. In FIG. 11, memory circuit 80 provides to FPGA 81 words of n bits of data at a time via a data bus 82. (Typically, n equals 8.) Prior to configuration (e.g. upon power-up or system reset), memory circuit 80 asserts a reset signal on a line 83, indicating to FPGA 81 that configuration is about to commence. Memory circuit 80 then provides a series of words of data on data bus 82, and a series of write control signals on a write control line 84. FPGA 81 responds to the write control signals by loading data from bus 82 into the configuration memory cells within FPGA 81. When FPGA 81 is done being configured, it asserts a signal on a line 85, thereby causing memory circuit 80 to tri-state the buffers driving data bus 82 and write control line 84.

Figure 12:
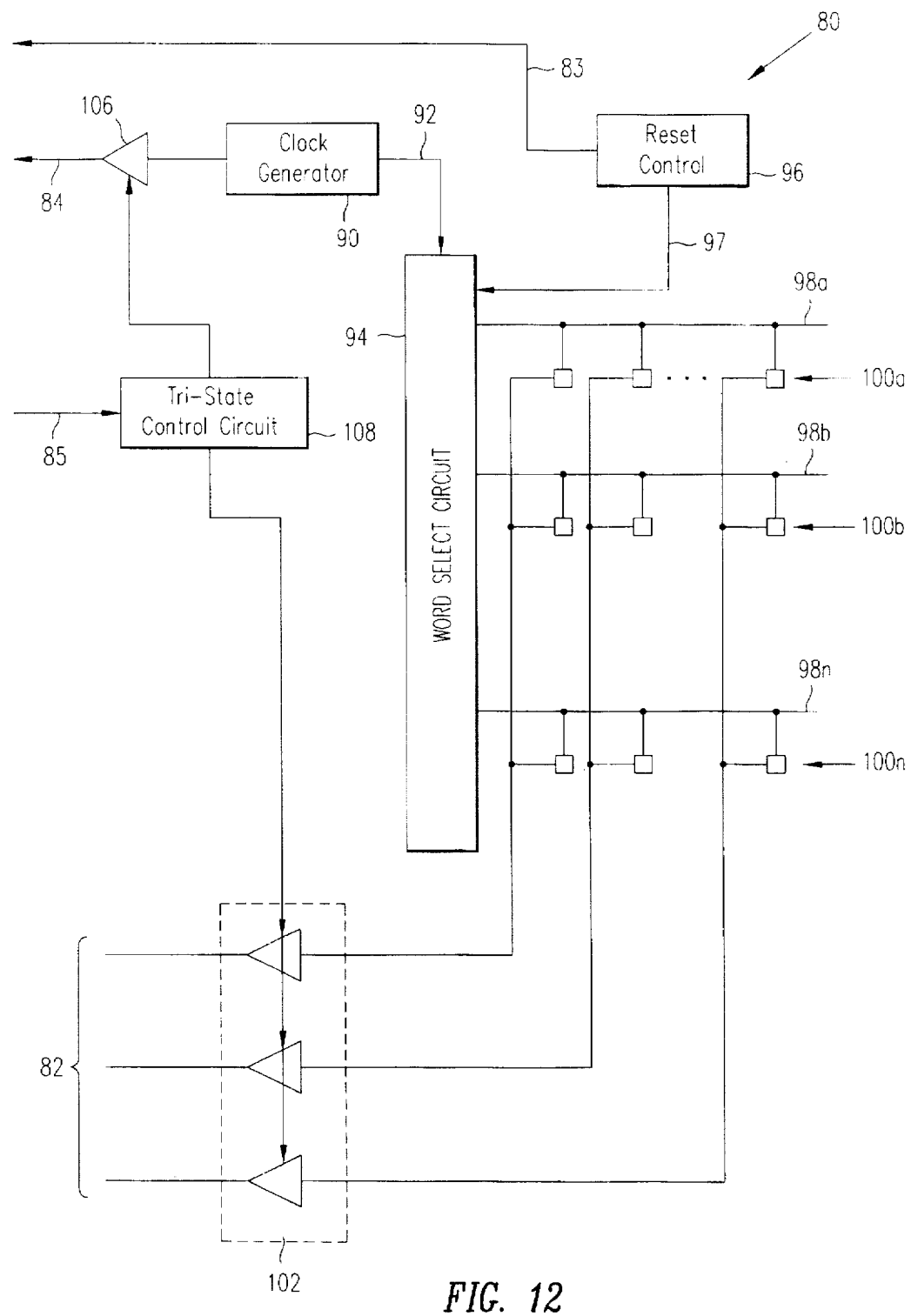
FIG. 12 is a block diagram of the parallel memory of FIG. 11.

FIG. 12 schematically illustrates memory circuit 80. Memory circuit 80 includes a clock generator 90 which provides a clock signal on a clock lead 92 to an address select circuit 94. Upon reset or power-up, a reset control circuit 96 applies a pulse to an address select circuit 94 via a lead 97, which asserts an active signal on a select lead 98a, thereby causing data from a first row of memory cells 100a to be provided to a tri-state driver circuit 102. Driver circuit 102 drives data bus 82 of memory 80. Clock generator 90 provides the write control signal on line 84 via a tri-state buffer 106.

Thereafter, clock generator 90 applies a clock signal on lead 92, causing address select circuit 94 to hold lead 98a inactive, and to assert an active signal select lead 98b. The active signal on lead 98b causes data from memory cells 100b to be provided to driver circuit 102, which in turn drives this data onto data bus 82. Another write control signal is then applied to lead 84. In this way, data is provided to FPGA 81 until configuration is complete. When configuration is complete, FPGA 81 asserts a signal on lead 85, which causes a tri-state control circuit 108 to tri-state buffer 106 and driver circuit 102.

In the embodiment of FIG. 12, the signal on lead 84 goes active every time a word of data is ready on line 82. Thus, the timing for the signal on lead 84 is similar to a write strobe signal used in the asynchronous peripheral mode configuration described on pages 2–40 and 2–41 in the Xilinx data book.

Alternatively, the frequency of the signal on lead 84 can be in n times the frequency of the signal on lead 92, where n is the width of data bus 82. Thus, the signal on lead 84 is used by FPGA 81 in a manner similar to the clock signal in the synchronous peripheral mode configuration described on pages 2–38 and 2–39 of the Xilinx Data Book.

Figure 13:
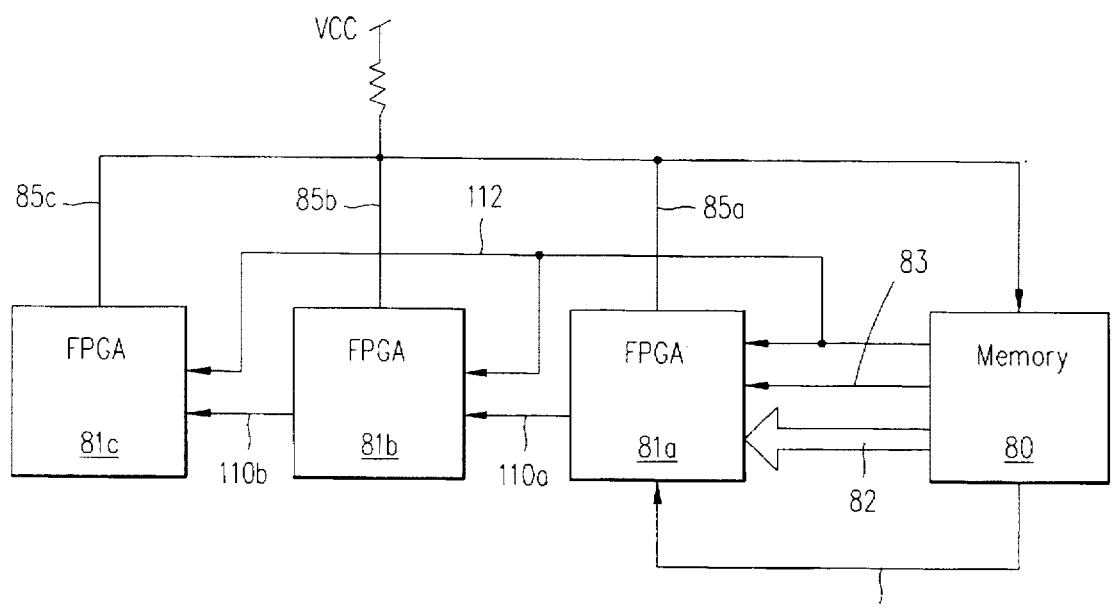
FIG. 13 schematically illustrates a plurality of FPGAs being configured by a parallel memory in accordance with a sixth embodiment of the invention.

FIG. 13, illustrates a variation of the structure of FIG. 12, in which a plurality of FPGAs 81a, 81b, and 81c are configured with data from memory circuit 80. In this embodiment, FPGA 81a includes a serial output lead 110a for providing serial data from FPGA 81a to FPGA 81b and FPGA 81b contains a serial output lead 110b for providing serial data to FPGA 81c. FPGAs 81a to 81c also receive a clock signal from memory circuit 80 via a clock lead 112. Of importance, FPGA 81a includes a shift register. After FPGA 81a is done configuring itself, it starts shifting data received from memory circuit 80 onto serial output lead 110a. The timing for shifting out data onto lead 110 is controlled by the clock signal on lead 112, generated by memory circuit 80. FPGA 81b then configures itself with data received from lead 110a. As soon as FPGA 81b is done configuring itself, it shifts configuration data out onto lead 110b so FPGA 81c can be configured. Thus, FPGA 81a receives its configuration data in parallel whereas FPGAs 81b and 81c receive their configuration data in series.

As with the previous embodiments, FPGAs 81a to 81c include output leads 85a to 85c that are AND-tied together and used to indicate to memory circuit 80 that configuration is complete.

Although FIG. 13 shows three FPGAs being configured using this technique, other numbers of FPGAs can be configured in this manner.

Figure 14:
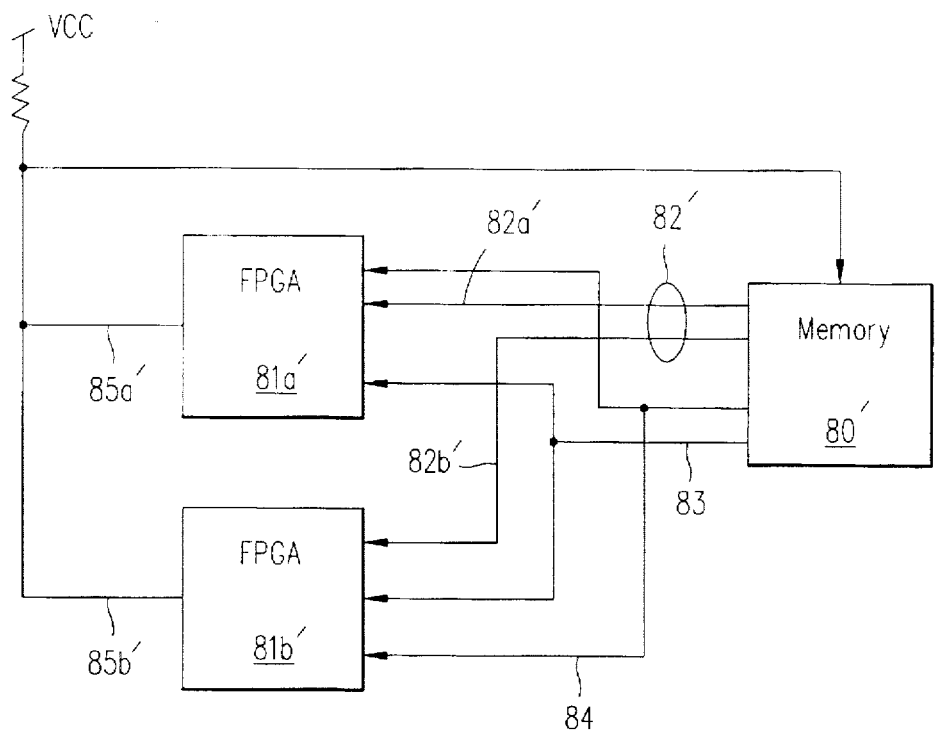
FIG. 14 schematically illustrates a seventh embodiment of the invention using a parallel memory having a data bus in which each line of the data bus is connected to an associated FPGA.

FIG. 14 illustrates a variation of the structure of FIG. 13 in which a plurality of FPGAs 81a', 81b' are each coupled to an associated lead of data bus 82'. During configuration, each FPGA 81a', 81b' receives a serial data stream from memory circuit 80' via its associated lead 82a', 82b' of bus 82', and uses that data to configure itself. Of importance, each FPGA 81a', 81b' also receives the write control signal from lead 84 to control timing. In this way, FPGAs 81a', 81b' are simultaneously configured in parallel. As in the previous embodiments, when configuration is complete, each FPGA 81a', 81b' asserts a signal on its associated lead 85a', 85b'. Leads 85a' and 85b' are AND-tied together and are coupled to memory circuit 80'. Memory circuit 80'responds to the signal on leads 85a' and 85b' by tri-stating the circuitry that drives bus 82'. Although FIG. 14 shows only two FPGAs being programmed in this manner, data bus 82' can have more than two bus leads (typically bus 82' contains eight bus leads), and thus other numbers of FPGAs can be configured in parallel using this technique.

Figure 15:
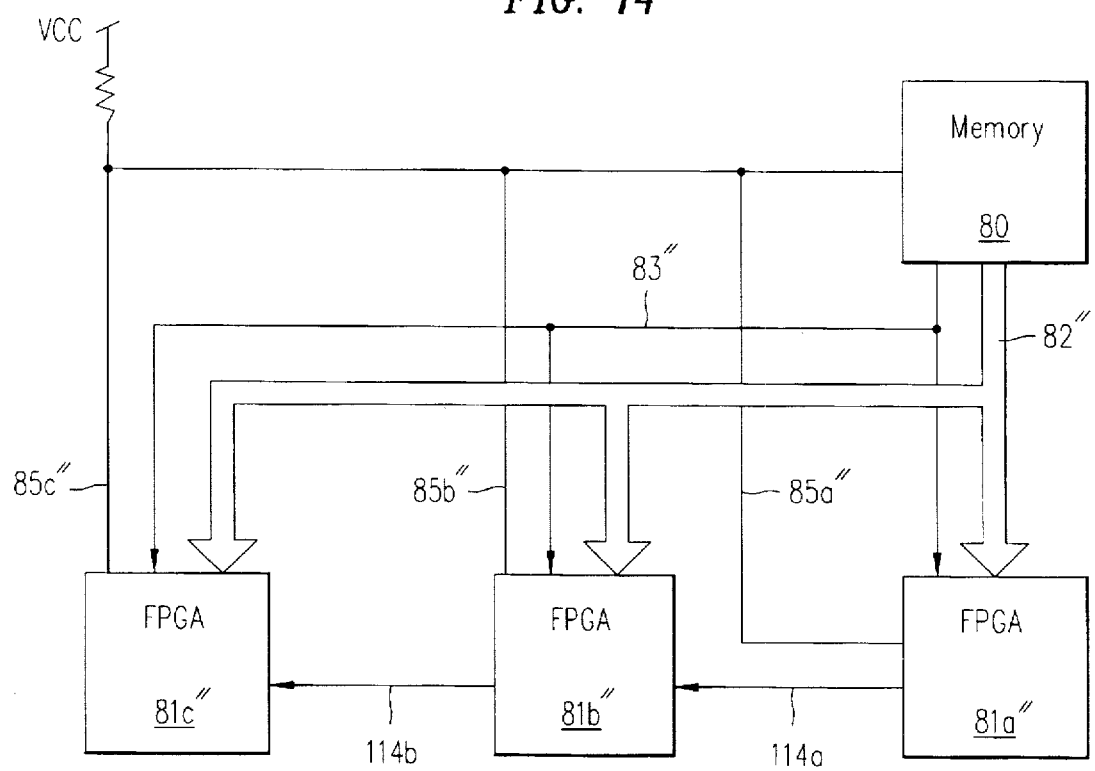
FIG. 15 schematically illustrates an eighth embodiment of the invention in which three FPGAs receive configuration data in parallel.

FIG. 15 illustrates an embodiment of the invention in which three FPGAs 81a" to 81c" are coupled to memory circuit 80 via a data bus 82" and write control lead 83". At the start of configuration, FPGAs 81a" and 81b" assert inactive signals on leads 114a and 114b, respectively. At the start of configuration, FPGA 81a" receives configuration data from bus 82" and configures itself in response thereto. When FPGA 81a" is done configuring itself, it holds lead 114a active and thereafter ignores the data on bus 82". FPGA 81b " responds to the signal on lead 114a by using the data from bus 82" to configure itself. When FPGA 81b" is done configuring itself it holds lead 114b active, and thereafter ignores the data on bus 82". FPGA 81c" then uses the data on bus 82" to configure itself.

While my invention has been described with reference to specific embodiments, those skilled in the art will realize that changes can be made in form and detail without departing from the spirit and scope of my invention. For example, the FPGAs in the embodiments of FIGS. 9 to 15 can provide INIT signals to initialize or permit configuration as discussed above in relation to FIGS. 5b and 8b.

It is also noted various programmable logic devices having reprogrammable memory cells can be used in accordance with my invention. Thus, EEPROM or SRAM-based PLA and PAL-type architecture devices can be used with a memory in accordance with my invention. ("PAL" and "PLA" are well known terms. See, for example, the LSI Databook, published by Monolithic Memories, Inc. in 1985, incorporated herein by reference, and in particular, chapter 5.)

Further, the memories described above receive a signal from the FPGA or FPGAs indicating when configuration is complete (e.g. the signal on leads 38 and 85). In another embodiment, the memories are programmed with information indicative of the location of the last bit of data needed to configure the FPGAs. In this embodiment, memory circuits 30 and 80 contain circuitry that tri-states clock and data output lines (or data and write control lines) without having to receive a signal from the FPGAs indicative of completion of configuration.

In the embodiment of FIGS. 5a, 8a, 9 and 10, memory circuit 30 provides a signal on line 36 indicating when configuration is about to commence. In an alternative embodiment, line 36 need not be present and FPGA 37 can rely on a clock pulse on line 35 to indicate when configuration is about to commence. In like manner, in a variation of the embodiment of FIGS. 11 to 15, lead 83 is eliminated, and FPGAs 81 rely on a write control signal on lead 84 for an indication as to when configuration is to begin.

In one modification of the embodiment of FIG. 12, memory circuit 80 can be programmable to either use the clock signal generated by clock generator 90 or to receive an externally generated clock circuit, e.g. as in FIG. 7b.

Figure 7C:
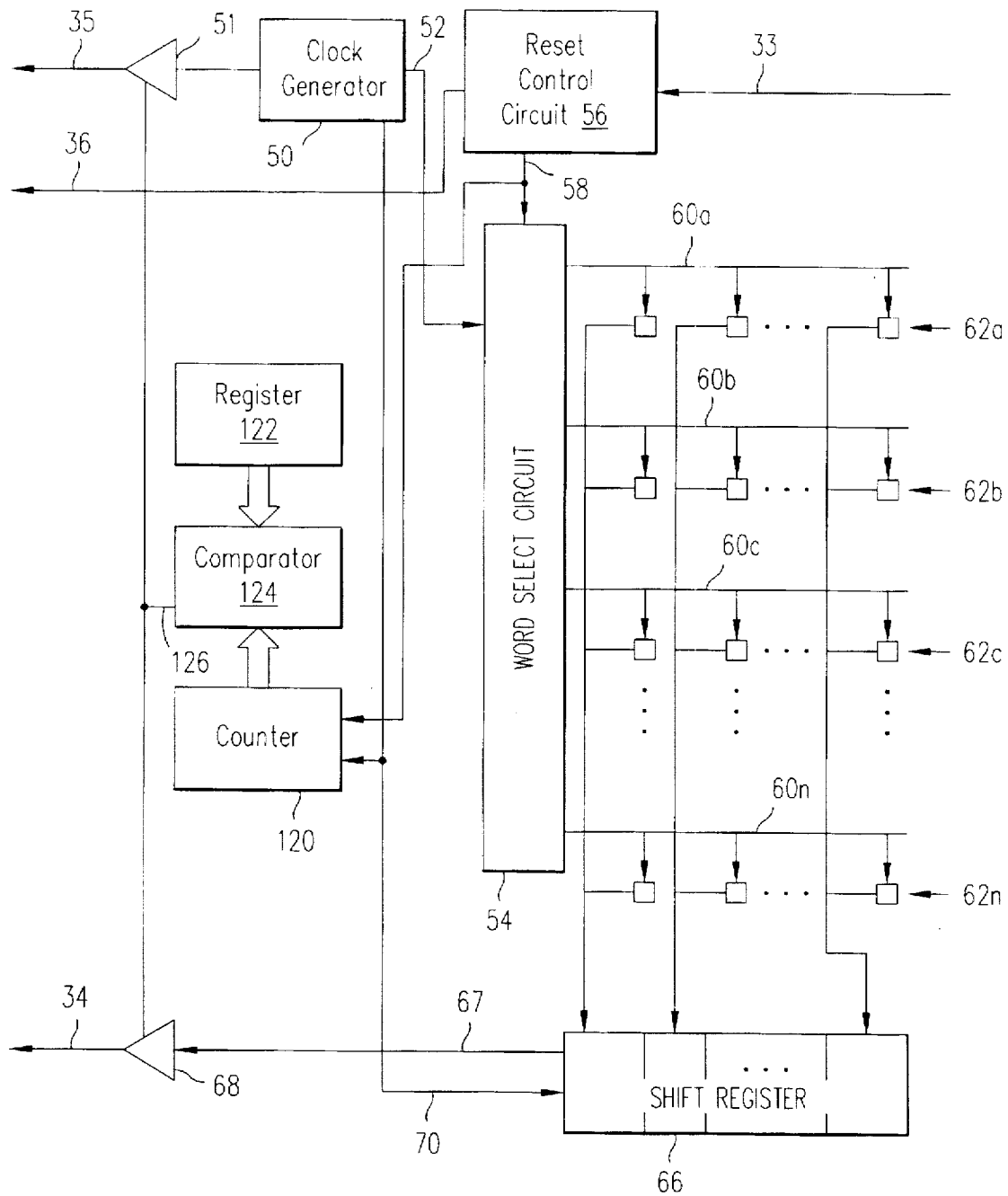
FIG. 7c to 7e are block diagrams of other embodiments of a memory circuit including means for ascertaining when the last bit of configuration data has been provided to an FPGA.
Figure 7D:
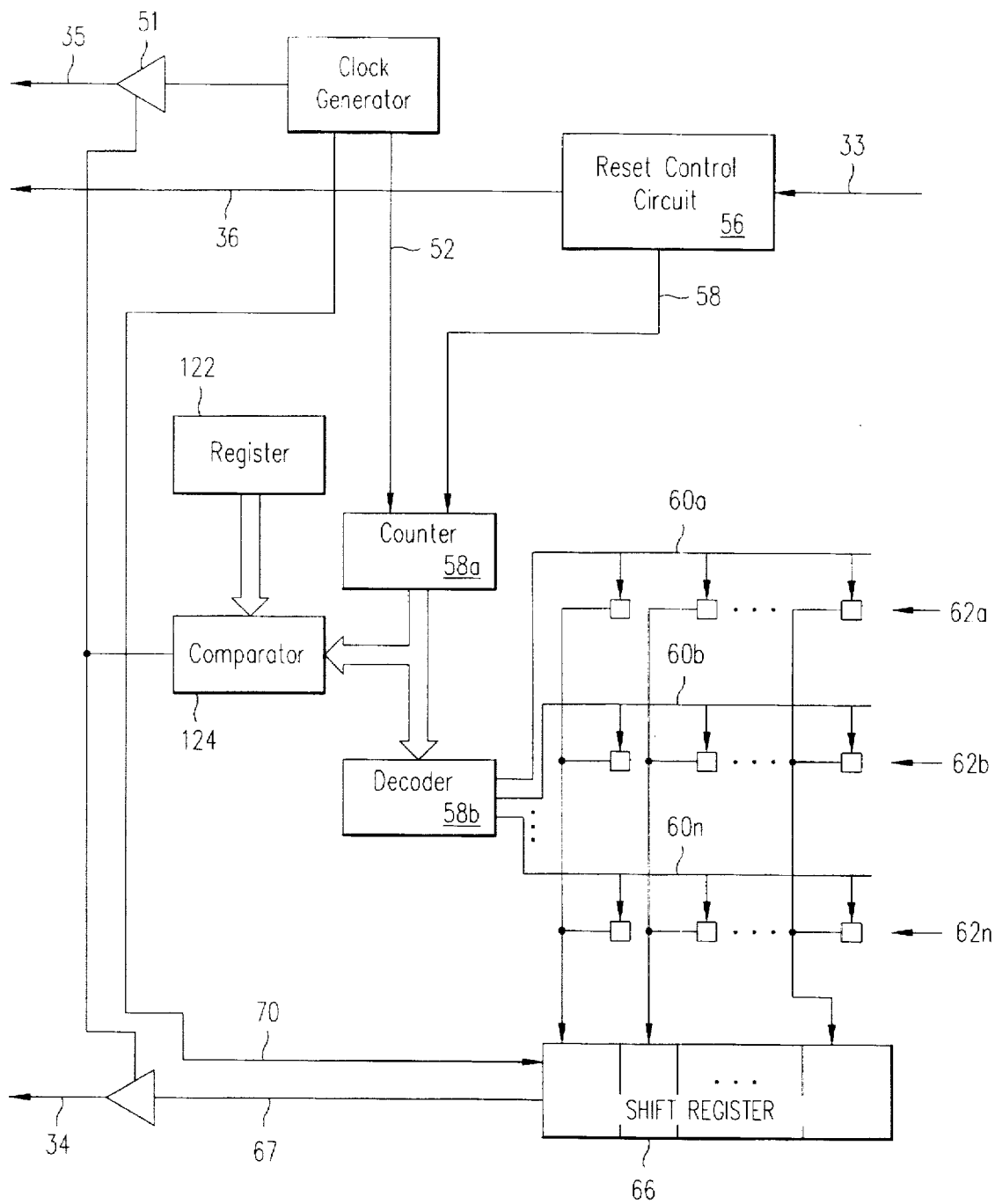
Figure 7E:
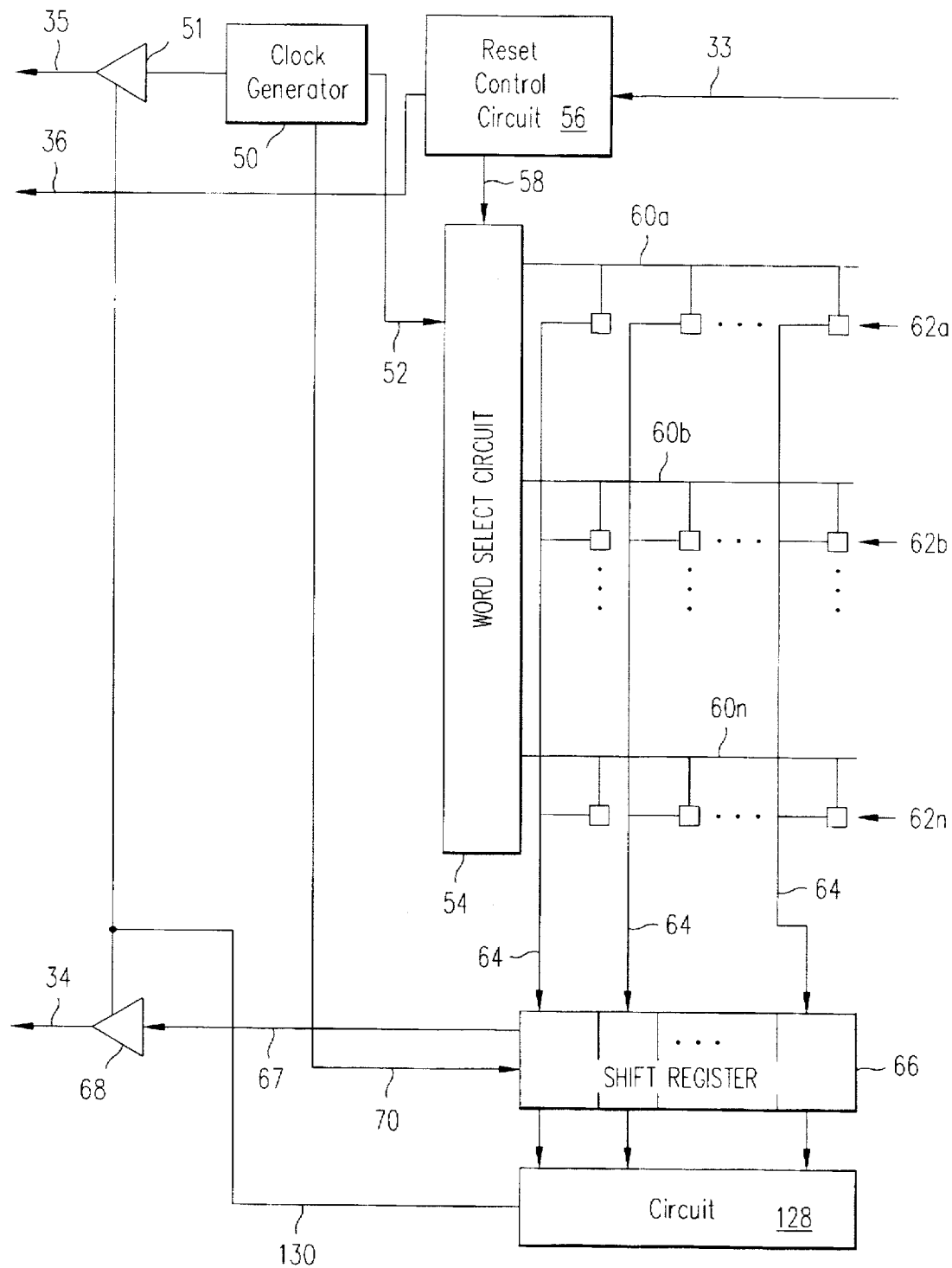

In FIG. 12, the memory circuit can contain means for determining when the last word of data has been provided to an FPGA, similar to FIGS. 7c to 7e. The memory circuit can then communicate a DONE signal to the FPGA or FPGAs receiving the configuration data.

The structures depicted in FIG. 7a are typically formed within a single integrated circuit. Similarly, the structures in the embodiments of FIGS. 7b to 7e and 12 can also be formed within a single integrated circuit.

In one embodiment, the FPGAs can be configured in a number of the ways described above. In such an embodiment, the FPGAs contain one or more mode control pins which receive signals indicating how the FPGAs are to be configured (e.g. in series or parallel).

The FPGAs and memories can be constructed using any appropriate technology, e.g. NMOS, PMOS, CMOS, bipolar, etc. The FPGAs can route data from their pins to configuration memory cells as discussed above or as described in U.S. patent application Ser. No. 08/223,247, filed Apr. 1, 1994 by Erickson, et al., incorporated herein by reference. Other modifications of the invention will be apparent to those of ordinary skill in the art in light of the foregoing description.

We claim:

1. A memory integrated circuit comprising:

a plurality of memory cells;

a clock output signal line;

at least one serial output lead;

an oscillator for generating a first clock signal and providing said first clock signal on said clock output signal line; and circuitry which obtains a word of data from said memory cells, said word of data comprising a plurality of bits of data, said circuitry also providing said bits of data on said at least one serial output lead in series in synchronization with said first clock signal, wherein said memory cells, clock output signal line, oscillator and circuitry are all formed on a single integrated circuit.

2. Circuit of claim 1 wherein said memory integrated circuit is part of a logic system comprising a programmable logic device, said memory integrated circuit providing configuration data to said programmable logic device.

3. Circuit of claim 2 wherein said programmable logic device is a first FPGA, and wherein said memory integrated circuit commences providing said first data to said FPGA upon system power-up.

4. Circuit of claim 3 wherein said first FPGA comprises means for communicating an output signal indicating when configuration of said first FPGA is complete, and wherein said memory integrated circuit comprises means for receiving said output signal, said memory integrated circuit ceasing providing said data in response to said output signal.

5. Circuit of claim 4 wherein said first FPGA comprises a FPGA serial output lead, said system further comprising a second FPGA having a data input lead coupled to said FPGA serial output lead and a clock input lead coupled to said clock output signal line, said first FPGA providing configuration data to said second FPGA on said FPGA serial output lead.

6. Circuit of claim 2 wherein said programmable logic device comprises means for communicating to said memory integrated circuit when said programmable logic device is in a state such that it can receive data from said memory integrated circuit.

7. Circuit of claim 1 further comprising means for causing said oscillator to commence generating clock signals upon power-up.

8. Circuit of claim 1 wherein said memory integrated circuit further comprises means for indicating when a last selected bit from said memory cells has been provided on said at least one serial output lead.

9. Circuit of claim 8 further comprising tri-state buffers for driving said clock output signal line and said at least one serial output lead, and wherein said means for indicating causes said tri-state buffers to go into a tri-state mode when said last selected bit has been provided on said at least one serial output lead.

10. Memory integrated circuit of claim 1 wherein said memory integrated circuit further comprises means for receiving a second clock signal from a source external to said memory integrated circuit, and wherein said circuitry is operable in a mode wherein said data is provided on said serial output lead in synchronization with said second clock signal.

11. Memory integrated circuit of claim 10 wherein said clock output signal line is bidirectional so that said memory integrated circuit can both provide clock signals on and receive clock signals from said clock output signal line.

12. Memory integrated circuit of claim 11 further comprising a multiplexer having a first input lead for receiving a clock signal from said bidirectional clock output signal line and a second input lead for receiving a signal from said oscillator, and wherein the data provided on said at least one serial output lead is in synchronization with the signal on either said first input lead of said multiplexer or said second input lead of said multiplexer.

13. Memory integrated circuit of claim 11 further comprising a memory cell for controlling whether said memory integrated circuit receives clock signals from said clock output signal line or provides clock signals to said clock output signal line.

14. Circuit of claim 11 further comprising a mode control input lead for controlling whether said memory integrated circuit receives clock signals from said clock output signal line or provides clock signals to said clock output signal line.

15. A memory integrated circuit comprising:

a data bus;

means for storing data and providing words of data on said data bus;

an oscillator;

a lead for receiving a clock signal from a source external to said memory integrated circuit; and clock means operable in a first mode for generating timing signals in response to said oscillator, said timing signals controlling the timing by which said words of data are provided on said data bus, and for providing control signals so that a device external to said memory integrated circuit can retrieve said data on said data bus, said clock means being operable in a second mode for generating said timing signals in response to said clock signal received from said source external to said memory integrated circuit.

16. A memory integrated circuit comprising:

a plurality of memory cells;

a clock output signal line;

at least one serial output lead;

an oscillator for generating a first clock signal and providing said first clock signal on said clock output signal line; and first circuitry which obtains data from said memory cells, said first circuitry also providing said data on said at least one serial output lead in synchronization with said first clock signal, wherein said memory cells, clock output signal line, oscillator and first circuitry are all formed on a single integrated circuit, wherein said memory integrated circuit further comprises second circuitry which can receive a second clock signal from a source external to said memory integrated circuit, and wherein said first circuitry is operable in a mode wherein said data is provided on said serial output lead in synchronization with said second clock signal.

17. Circuit of claim 16 wherein said first circuitry comprises a shift register for receiving said word of data and shifting the bits of said word onto said serial output lead.

18. Circuit of claim 16 wherein said second circuitry includes a multiplexer for receiving the first and second clock signals, said multiplexer determining whether said memory integrated circuit is responsive to said second clock signal.

19. Circuit of claim 16 wherein said circuit includes a control lead for receiving a signal from a source external to said memory integrated circuit indicating whether said memory integrated circuit is to be responsive to said second clock signal.

20. Circuit of claim 16 further comprising a memory cell for providing a signal indicating whether said memory integrated circuit is to be responsive to said second clock signal.

21. Circuit of claim 16 wherein said clock output signal line is bidirectional, said memory integrated circuit receiving said second clock signal on said clock output signal line.

22. Circuit of claim 16 further comprising a clock input signal line for receiving said second clock input signal.

23. Circuit of claim 16 wherein said memory integrated circuit comprises a tristate buffer driving said at least one serial output lead, said tristate buffer going into a tristate mode in response to said means for determining determining that said last bit of configuration data has been communicated to said programmable logic device.

24. A system comprising:
- a programmable logic device;
- a memory integrated circuit for providing data on a data bus and for generating a write control signal and providing said write control signal on a write control line to said programmable logic device, wherein said write control signal is a clock signal having a frequency equal to n times the rate at which words of data appear on said data bus, where n is an integer greater than 1 and equals the width of said data bus; and
- said programmable logic device receiving said data and said write control signal and using said data to configure itself.

25. A memory integrated circuit comprising:
- a plurality with memory cells;
- a clock output signal line;
- at least one serial output lead;
- an oscillator for generating a first clock signal and providing said first clock signal on said clock output signal line; and
- first circuitry which obtains data from said memory cells, said first circuitry also providing said data on said at least one serial output lead in synchronization with said first clock signal, wherein said memory cells, clock output signal line, oscillator and first circuitry are all formed on a single integrated circuit;
- second circuitry which can receive a second clock signal from a source external to said memory integrated circuit, wherein said first circuitry is operable in a second mode which provides said data on said at least one serial output lead in synchronization with said second clock signal,
- and wherein said memory integrated circuit is part of a logic system comprising a programmable logic device, said memory integrated circuit providing configuration data to said programmable logic device,
- wherein said logic system comprises a plurality of programmable logic devices, said memory integrated circuit providing configuration data to said plurality of programmable logic devices, said system comprising a DONE signal wire, each of said programmable logic devices being coupled to said DONE signal wire and pulling said DONE signal wire to a predetermined voltage level when said programmable logic devices are not done being configured, said DONE signal wire being coupled to said memory integrated circuit, wherein said memory integrated circuit stops sending data on said serial output lead and stops sending clock signals on said clock output signal line when the signal on said DONE signal wire is at a state indicating that all of said programmable logic devices are done being configured.

26. Circuit of claim 25 wherein said memory integrated circuit comprises a first tristate buffer driving said clock output signal line and a second tristate buffer driving said serial output lead, said first and second tristate buffers going into a high impedance mode when said DONE signal wire contains a signal indicating that said programmable logic devices are done being configured.

27. Circuit of claim 26 wherein each of said programmable logic devices comprises an open drain buffer for driving said DONE signal wire.

28. Circuit of claim 25 wherein each of said programmable logic devices comprise a counter, and each of said programmable logic devices cease pulling said DONE signal wire to said predetermined voltage level when the counters in said programmable logic devices indicate that all of said programmable logic devices are done being configured.

29. Circuit of claim 25 wherein each of said programmable devices ceases pulling said DONE signal wire to said predetermined voltage level as each programmable logic device is finished being configured.

30. System comprising:
- a memory integrated circuit for providing configuration data on a data lead; and
- a programmable logic device for receiving said configuration data from said data lead and using said configuration data to configure itself, wherein said memory integrated circuit includes means for determining when the last bit of configuration data has been communicated to said programmable logic device, wherein said means for determining comprises means for detecting a code word provided by said memory cells within said memory integrated circuit.

31. system comprising:
- a data line;
- a clock line;
- a first memory device comprising a clock generator for generating a clock signal and providing said clock signal on said clock line, a plurality of memory cells, and circuitry for obtaining data from said memory cells and providing said data on said data line in synchronization with said clock signal, said first memory device also including a last bit line for providing a last bit signal when the last bit of data is provided by said first memory device; and
- a second memory device comprising a last bit input lead coupled to said last bit line for receiving said last bit signal, a clock generator for generating a clock signal and providing said clock signal on said clock line upon receipt of said last bit signal by said second memory device, a plurality of memory cells, and circuitry which provides data on said data line in synchronization with said clock signal provided by said second memory device clock generator when said last bit signal has been received by said second memory device.

32. System of claim 31 wherein said first memory device is a single integrated circuit and said second memory device is a single integrated circuit.

33. A memory integrated circuit comprising:
- a clock generator for generating a first clock signal and a second clock signal;
- an address counter for receiving said first clock signal and providing addresses in response thereto;
- a memory circuit for receiving said addresses and providing a word of data in response thereto;
- a shift register for shifting said word of data onto a data output lead in synchronization with said second clock signal; and
- a clock output lead coupled to said clock generator for providing said second clock signal.

* * * * *